(12) United States Patent
Liu et al.

(10) Patent No.: US 6,395,622 B1
(45) Date of Patent: May 28, 2002

(54) MANUFACTURING PROCESS OF SEMICONDUCTOR DEVICES

(75) Inventors: An-Hong Liu, Tainan; Yuan-Ping Tseng, Hsinchu, both of (TW)

(73) Assignee: Chipmos Technologies Inc. (TW)

( * ) Notice: Subject to any disclaimer, the term of this patent is extended or adjusted under 35 U.S.C. 154(b) by 0 days.

(21) Appl. No.: 09/873,421

(22) Filed: Jun. 5, 2001

(51) Int. Cl.⁷ ................................................ H01L 21/36
(52) U.S. Cl. .................... 438/497; 438/478; 438/166; 438/753
(58) Field of Search ...................... 365/201; 324/763, 324/757; 438/660, 497, 478, 753

(56) References Cited

U.S. PATENT DOCUMENTS

| | | | |
|---|---|---|---|
| 5,326,709 A | 7/1994 | Moon et al. ............... 437/8 |
| 5,657,280 A | 8/1997 | Shin et al. ................ 365/200 |
| 5,904,859 A | 5/1999 | Degani .................... 216/18 |
| 5,910,678 A | 6/1999 | Lou et al. ................. 257/529 |
| 5,977,632 A | 11/1999 | Beddingfield ............ 257/737 |
| 6,101,618 A | 8/2000 | McClure ................... 714/27 |
| 6,121,073 A | 9/2000 | Huang et al. ............. 438/132 |
| 6,233,184 B1 * | 5/2001 | Barth ....................... 365/201 |

* cited by examiner

Primary Examiner—John F. Niebling
Assistant Examiner—André C Stevenson
(74) Attorney, Agent, or Firm—Troxell Law Office PLLC

(57) ABSTRACT

A manufacturing process of semiconductor devices comprises providing at least a wafer, bumping the wafer, testing the wafer, laser repairing, and dicing. The step of testing one bumped wafer is contained after bumping and before laser repairing in order to shorten the procedures and increase throughput

6 Claims, 5 Drawing Sheets

PRIOR ART  FIG. 1

MANUFACTURING PROCESS OF SEMICONDUCTOR DEVICES

FIELD OF THE INVENTION

The present invention is relating to a manufacturing process of semiconductor devices, particularly to a manufacturing process of flip-chip-typed semiconductor devices, wherein the semiconductor devices have fuses connecting to the redundancy circuits.

BACKGROUND OF THE INVENTION

Conventionally the manufacturing process of semiconductor chip is shown in the FIG. 1 mainly comprises providing the wafer 11, wafer sort (1) 12 (pre-laser testing), laser repairing 13, wafer sort (2) 131 (post-laser testing), dicing 14, packaging 15, final testing (1) 16, bum-in 17 and final testing (2) 18, etc. Wherein providing the wafer 11, wafer sort (1) 12, laser repairing 13, wafer sort (2) 131 and dicing 14 are completed at a front section of the integrated circuit forming factory such as the foundry manufacturer, then packaging 15, final testing (1) 16, burn-in 17 and final testing (2) 18 are executed at a rear section of the packaging and testing factory.

At the front section of the integrated circuit forming factory, at first is to provide a wafer 11 and form a plurality of chips in the wafer (called integrated circuit layout). Thereafter "testing" 12 is to examine good chips, repairable bad chips and non-repairable bad chips, then laser repair 13 the repairable bad chips to good chips and finally test (2) 18 them to make sure they are good chips, finally dice the wafer 14 and obtain a plurality of good chips. At the rear section of the! packaging and testing factory, in order to enable the chips become suitable packaging structure, package the good chips 15 (such as the packaging type of SOP, DIP, QFP or BGA). After packaging usually execute the final testing (1) 16 for making sure if the packaged chips can imitate deteriorating burn-in operation, pick the bad chips out in advance and prevent damaging the equipment of burn-in, then perform the burn-in 17. After burn-in execute final testing (2) 18, examine and sort the chips which are well-packaged and through burn-in, thereafter execute pre-shipment inspection 19 such as marking, final testing (3), and check before shipping, after the processes mentioned above the modular assembling process can be continuously executed. In fact there are difficulties for too many manufacturing steps and having to perform multi-testing and multi-examination to maintain the quality in the manufacturing process. Besides, after being packaged in the packaging and testing factory the chips can not be laser repaired any more for the packaging thickness and uneasy to keep position in the package body so that the ratio of good chips is unable to be increased efficiently.

A testing process of semiconductor devices is described from U.S. Pat. No. 5,326,709 entitled "WAFER TESTING PROCESS OF A SEMICONDUCTOR DEVICE COMPRISING A REDUNDANCY CIRCUIT". Wherein the semiconductor device has a redundancy circuit, at first partially etch PSG film and nitride film on a wafer for opening the bonding pads, thereafter execute "testing before laser repairing", "laser repairing", "testing repaired chips", and "off-line inking" in order. The Patent mainly mentions about the link of testing and laser repairing process but nothing about burn-in process at all. The foregoing burn-in is to execute packaging, the defect is that the bad chips are unable to be repaired after packaging and bum-in mentioned above. Further, the Patent describes about wafer testing process for bare chip that is different from the present manufacturing process for flip-chip.

SUMMARY OF THE INVENTION

The main purpose of the present invention is to supply a manufacturing process of semiconductor devices, execute testing and repairing after bumping in order to shorten the testing process and increase the ratio for good chips.

In accordance with the present invention of manufacturing process of semiconductor devices mainly comprises:

(a) providing a wafer, the wafer includes a plurality of chips non-diced;

(b) forming a plurality of bumps in the wafer;

(c) testing the wafer for distinguishing repairable chips;

(d) laser repairing the repairable chips mentioned above; and (e) dicing the wafer for obtaining a plurality of flip-chip-typed chips being through burn-in and testing.

Thereby achieve uniting the front and rear manufacturing process of semiconductor and the efficacy for increasing the ratio of good chips.

DETAIL DESCRIPTION OF THE INVENTION

Figure 1:
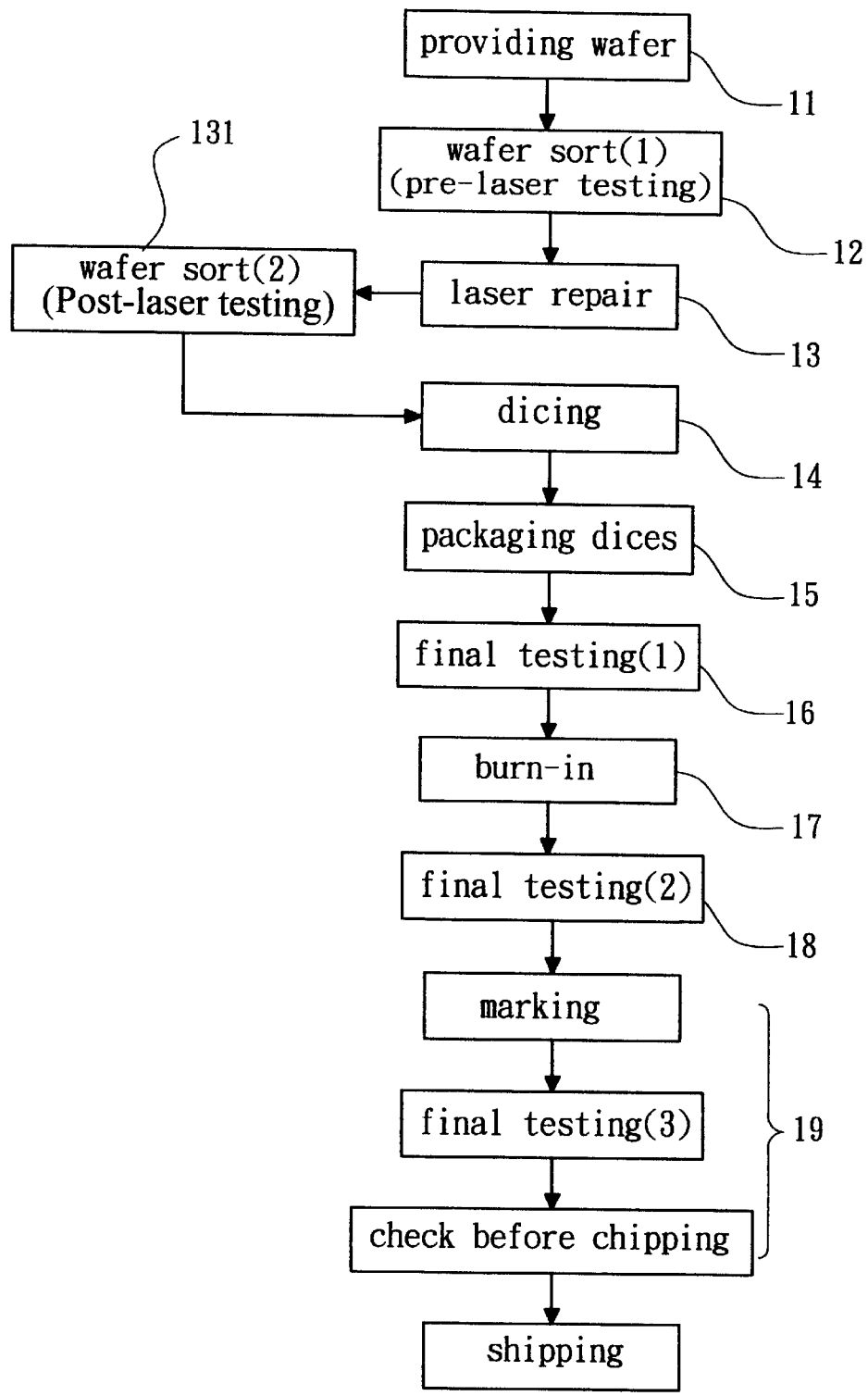
FIG. 1 is a packaging and manufacturing flowchart for conventional chips.

Please referring to the drawings attached, the present invention will be described by means of an embodiment below.

Figure 2:
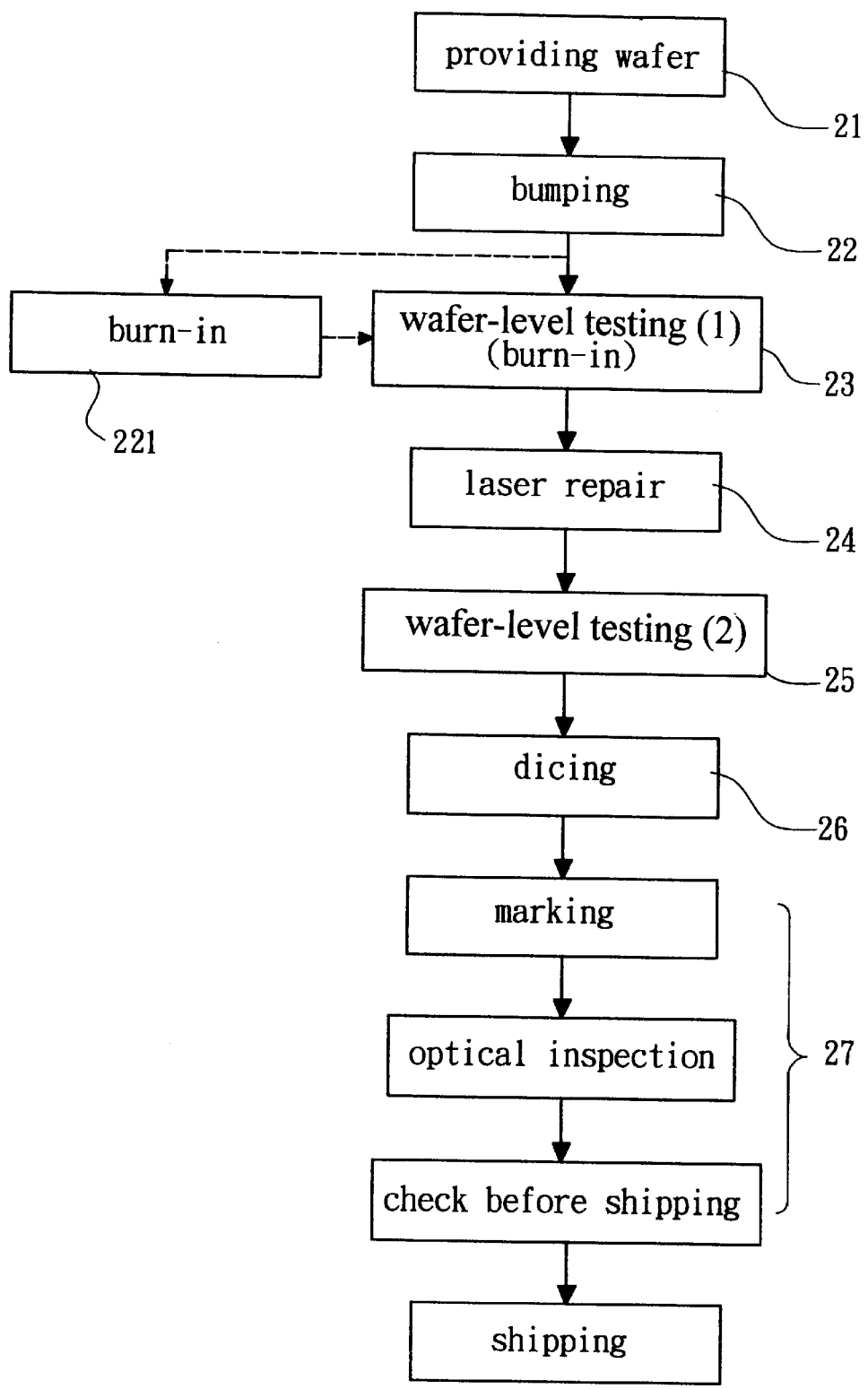
FIG. 2 is the manufacturing flowchart of semiconductor devices for the present invention.

As shown in FIG. 2, according to the manufacturing process of semiconductor devices for the present invention, the main steps in order comprising "providing wafer"21, "bumping" 22, "wafer level testing (1)" 23, "laser repairing" 24, "wafer level testing (2)" 25, "dicing" 26 and "pre-shipment testing" 27, etc are described in detail below.

Figure 3A:
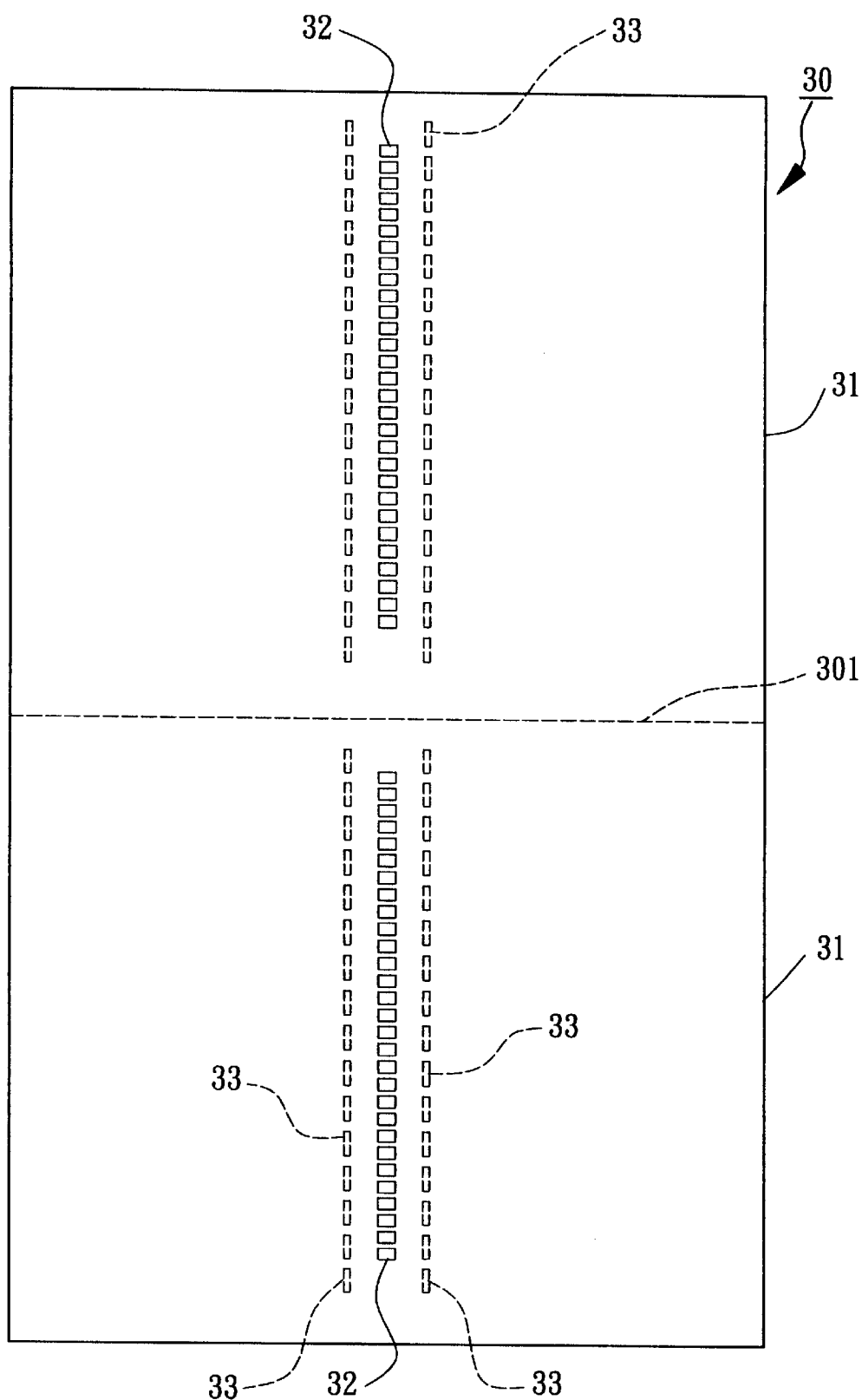
FIG. 3a is a top view for general silicon substrate.

At first in the step of "providing wafer"21, by means of well-known manufacturing process of semiconductor and methods (such as the technique of deposition, dry etching, photo lithography etc) make a wafer having at least an integrated circuit layout. The wafer can be a silicon or gallium arsenide substrate and forms a plurality of chips non-diced (from hundreds to thousands). Generally it is better that formed single chip is a memory chip such as DRAM, SRAM, SDRAM, Flash, Rambus or DDR, etc, or systematic single chip with memory. Generally speaking, the chips form redundancy circuits (or called redundancy cells) and fuses electrically connecting with redundancy circuits in rows or columns outside the integrated circuit area. By means of laser cut the suitable fuses to replace damaging circuits with redundancy circuits. According to the different manufacturing process the structures of redundancy circuits and fuses have various types such as U.S. Pat. Nos. 5,657,280, 6,121,073, 5,910,678 and 6,101,618, etc. In this embodiment as shown in FIG. 3a, the wafer mentioned above is indicated by the silicon substrate 30 having two chips 31, there is a cutting path 301 between two chips 31 for separating the two chips. The fuses 33 on each chip are adjacent to the bonding pads 32, then the bonding pads 32 expose to outside but the fuses 33 are covered by passivation layer of silicon substrate 30 itself.

Figure 3B:
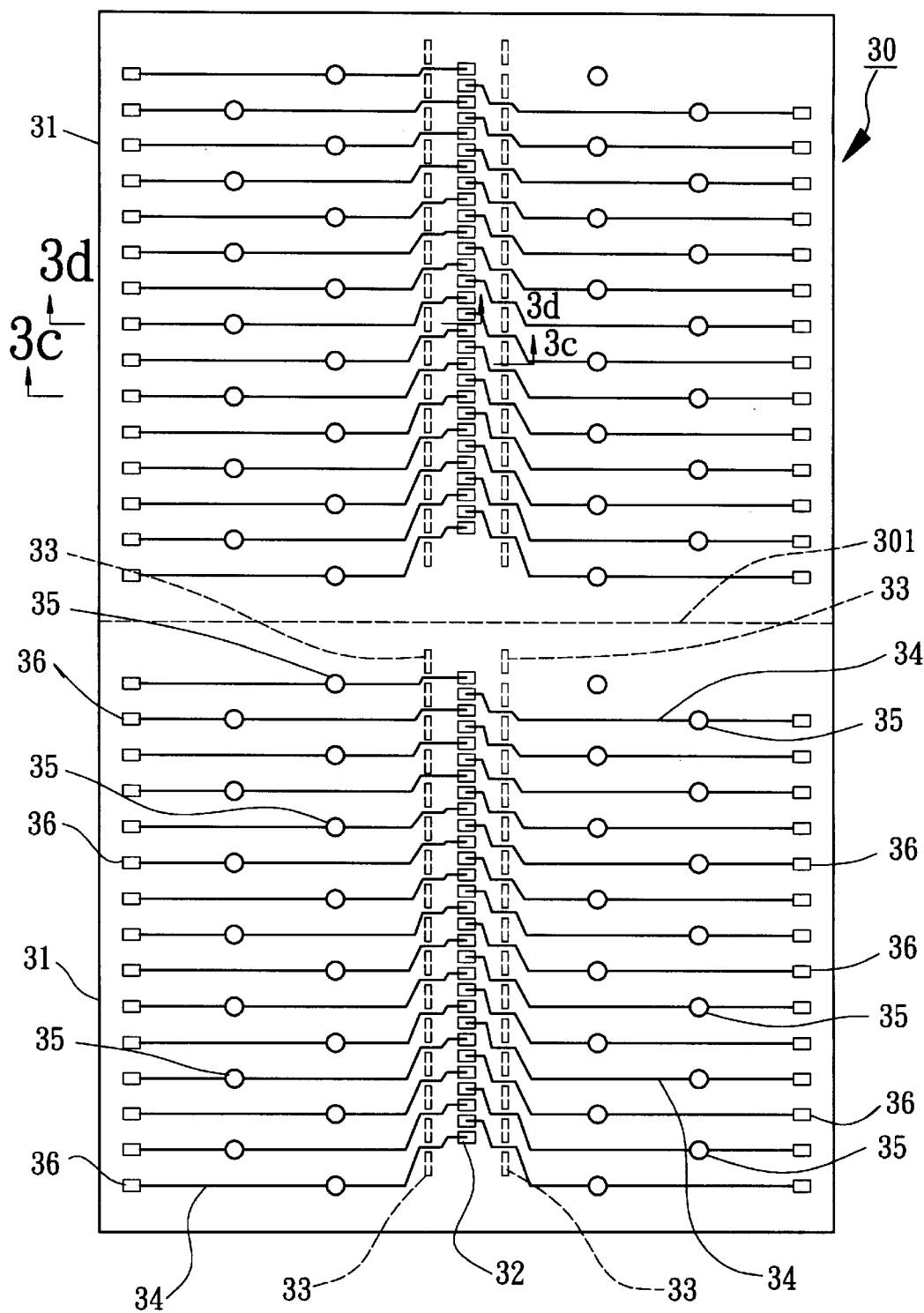
FIG. 3b is a top view of silicon substrate of flip-chip structure for the present invention.
Figure 3C:
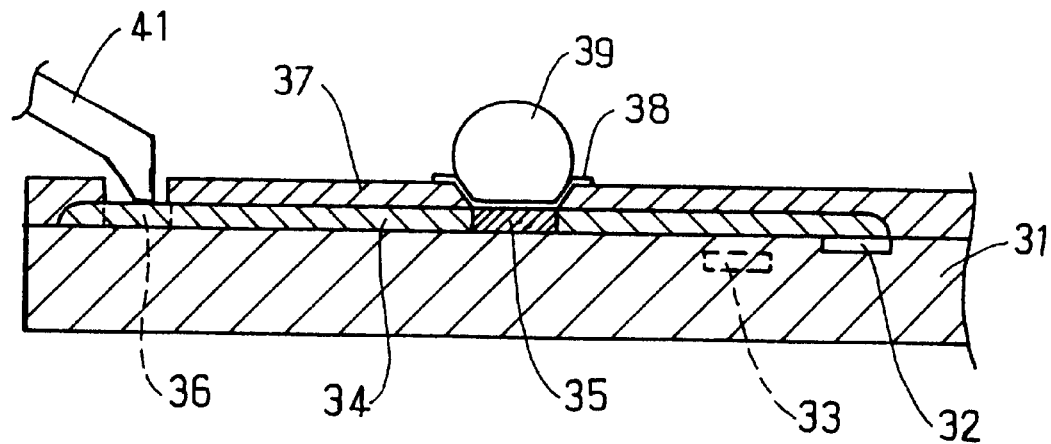
FIG. 3c is a cross sectional view in accordance with FIG. 3b Line 4—4.
Figure 3D:
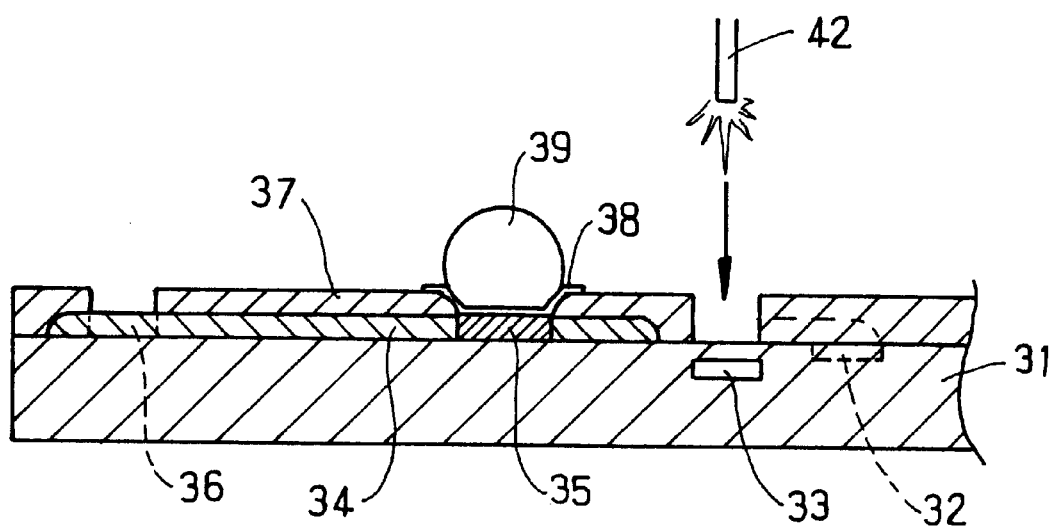
FIG. 3d is a cross sectional view in accordance with FIG. 3b Line 5—5.

Thereafter, in the step of "bumping 22", there are a plurality of conductive bumps 39 formed in the front of the wafer mentioned above. There are many methods about bumping technique of flip-chip for the present like electroplating, printing, evaporation, etc to become the bumps of gold or lead-tin alloy, etc. Referring to U.S. Pat. No. 5,977,632 for bump structure, usually it has to execute UBM (Under Bump Metallization) before bumping 39, this technique is mentioned in U.S. Pat. No. 5,904,859 too. In this embodiment as shown in FIG. 3b, at first form a plurality of conductive redistribution circuits 34 on the silicon substrate 30, each conduction circuit 34 electrically connects with the corresponding bonding pad 32, and forms a redistribution pad 35 under the bump 39 and a testing pad 36. Then package the silicon substrate 30 that is to cover the front of silicon substrate 30 with a flip-chip passivation layer 37 (as shown in FIG. 3c), for example, by using vapor deposition form silicon dioxide, oxysilicon, PSG or by using printing and baking form an epoxy compound (liquid compound) with elasticity for forming the flip-chip passivation layer 37. After that, by means of etching method open and expose the redistribution pad 35 and testing pad 36, it is better that meantime and partially remove the passivation layer 37 (or called packaging materials) above the fuse 33 for forming laser window (as shown in FIG. 3d), thus the thickness above the fuse 33 is thinner than other position for passivation layer 37 (even completely open the passivation layer 37 above the fuse) so that is favorable for laser repairing. Finally form the UBM metal layer 38 and bump 39 on the redistribution pad 35 (as shown in FIGS. 3b, 3c), thus the chips on the wafer have the "flip-chip" configuration for surface mounting. Thereafter, execute the step of "wafer level testing (1)" 23 to distinguish repairable chips before laser repairing. In the first embodiment as shown in FIG. 3c make the probe. 41 of testing equipment contact the testing pad 36 for electrically testing the chips 31 of the silicon substrate 30. It is better to execute "burn-in" 221 after bumping 22 for revealing latently bad chips (or short using life of chips) prior to executing the "wafer level testing (1)" 23, that is so called "wafer level burn-in". Alternatively, in the second embodiment put a wafer in the burn-in testing equipment, in general the environmental. condition of burn-in for wafer is to keep the temperature about 125° C.~150° C. and nonstop from 24 hrs. to 128 hrs. As shown in FIG. 3c, the probe head 41 of burn-in testing equipment contacts the testing pad 36 for electrically testing the chips 31 on the silicon substrate 30, during burn-in electrically testing wafer that is "wafer level burn-in and parallel testing". In the meantime of, during eliminating latently bad chips (or short using life of chips), electrically test many, chips of inside the wafer to distinguish durable good chips, repairable bad chips and non-repairable bad chips. Besides, before the step of "during bum-in wafer level testing" 23, the processes of "providing wafer" 21 and "bumping" 22 regard a wafer as an operation unit and treat a wafer by one time. In the "wafer level testing (1)" 23 process of the present invention to burn-in a plurality of wafers by one time under bum-in conditions is possible, that is to put a plurality of wafers in the burn-in oven at the same time and execute electrical testing during burn-in process for a long time so as to achieve shortening manufacturing time and quantity enhancement.

After the step of "wafer level testing, (1)" 23, right now the quality conditions of all chips on wafer have been grasped and "laser repair" 24 the repairable bad chips. In this embodiment as shown in FIG. 3d, that is to irradiate the repairable chips 31 with laser 42, cut the right place of fuses 33, and replace partial bad circuit with redundancy circuit for enabling the chips 31 become good chips. After laser repairing 24 execute at least one time "wafer level testing (2)" 25 to make sure if the repaired chips become good chips, and distinguish the chips for quality and speed which also can be performed on "wafer level testing (1)" 23. Thereafter, execute, the step of "dicing" 26 to obtain a plurality of flip-chip-typed chips 31 being through the steps of burn-in and testing, and it is possible to sort the chips in accordance with the results of "wafer level testing (2)" 25 mentioned above. Finally, after executing pre-shipment testing like printing, phototesting and shipment examination ship the goods.

Thus, a manufacturing process of semiconductor devices of the present invention is to execute testing and repairing (during burn-in) after bumping, that is to test wafer one time for grasping the conditions of each chip in wafer after the front part for integrated circuit layout and the rear part for bumping, irradiate the partial bad chips with laser again and repair them in order to obtain higher ratio of good chips and durableness of chips. In the meantime, the entire wafer completed following the manufacturing process of semiconductor devices may directly be shipped and assembled to effectively unite the former procedures of repackaging and retesting, and enhance manufacturing efficiency of semiconductor devices and common using of carrying equipments.

The above description of embodiments of this invention is intended to be illustrative and not limiting. Other embodiments of this invention will be obvious to those skilled in the art in view of the above disclosure.

What is claimed is:

1. A manufacturing process for semiconductor devices comprising the steps of:

(a) providing a silicon substrate having integrated circuits, bonding pads, redundancy circuits and fuses on one surface of the silicon substrate, wherein the fuses are electrically connected with corresponding redundancy circuits;

(b) forming conductive redistribution circuits on the surface of the silicon substrate, each conductive redistribution circuit electrically connecting with the corresponding bonding pad and each conductive redistribution circuit forming a redistribution pad and a testing pad;

(c) applying in liquid phase, a passivation layer covering the silicon substrate;

(d) opening the redistribution pads and the test pads of the conduction redistribution circuits through the passivation layer;

(e) forming a plurality of bumps on the redistribution pads for flip-chip mounting;

(f) electrically testing the silicon substrate by applying a test probe to the test pads to determine if there are repairable bad chips; and (g) laser repairing the repairable bad chips.

2. The manufacturing process for semiconductor devices of claim 1, wherein in the step of providing a silicon substrate includes providing a memory chip.

3. The manufacturing process for semiconductor devices of claim 1, wherein in the step of opening the redistribution pads includes partially removing the passivation layer over the fuses at the same time.

4. The manufacturing process for semiconductor devices of claim 1, wherein in the step of opening the redistribution pads includes opening the passivation layer over the fuses at the same time.

5. The manufacturing process for semiconductor devices of claim 1 comprising, after the step of laser repairing the further step of dicing the silicon substrate in order to obtain a plurality of flip-chip-typed chips passing through testing.

6. The manufacturing process for semiconductor devices of claim 5 comprising, after the step of laser repairing and before the step of dicing the silicon substrate, the further step of testing the wafer at least one time.

* * * * *